(12) United States Patent
Hofmann

(10) Patent No.: US 9,640,664 B2
(45) Date of Patent: May 2, 2017

(54) SOI FINFET WITH REDUCED FIN WIDTH DEPENDENCE

(71) Applicant: Soitec, Crolles (FR)

(72) Inventor: Franz Hofmann, Munich (DE)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/428,561

(22) PCT Filed: Sep. 10, 2013

(86) PCT No.: PCT/EP2013/068706
§ 371 (c)(1),
(2) Date: Mar. 16, 2015

(87) PCT Pub. No.: WO2014/040981
PCT Pub. Date: Mar. 20, 2014

(65) Prior Publication Data
US 2015/0214372 A1    Jul. 30, 2015

(30) Foreign Application Priority Data

Sep. 17, 2012   (FR) ...................... 12 58696

(51) Int. Cl.
| H01L 27/088 | (2006.01) |
| H01L 29/78 | (2006.01) |
| H01L 27/12 | (2006.01) |
| H01L 27/02 | (2006.01) |
| H01L 29/66 | (2006.01) |

(52) U.S. Cl.
CPC ...... *H01L 29/7856* (2013.01); *H01L 27/0214* (2013.01); *H01L 27/0886* (2013.01); *H01L 27/1211* (2013.01); *H01L 29/66795* (2013.01); *H01L 29/7855* (2013.01)

(58) Field of Classification Search
CPC ........... H01L 29/7856; H01L 29/66795; H01L 27/0214; H01L 27/0886; H01L 29/7855; H01L 27/1211
See application file for complete search history.

(56) References Cited

U.S. PATENT DOCUMENTS

| 2007/0189060 A1* | 8/2007 | Inaba ................... G11C 11/412 365/154 |
| 2009/0261423 A1* | 10/2009 | Sawada ................. H01L 29/785 257/392 |
| 2010/0032671 A1 | 2/2010 | Marshall |

OTHER PUBLICATIONS

Dauge et al, Coupling Effects and Channels Separation in FinFETs, Solid State Electronics, Elsevier Science Publishers, vol. 48, No. 4, Apr. 1, 2004, pp. 535-542.

(Continued)

*Primary Examiner* — Thanh Y Tran
(74) *Attorney, Agent, or Firm* — TraskBritt

(57) ABSTRACT

The present invention relates to a method for polarizing at least a first finfet transistor and a second finfet transistor, wherein the first finfet transistor has a fin width bigger than the fin width of the second finfet transistor, and both the first finfet transistor and the second finfet transistor have a back gate, and the method comprising applying the same first voltage on the back gate of the first finfet transistor and on the back gate of the second finfet transistor so as to reduce the spread between the off-current value of the first finfet transistor and the off-current value of the second finfet transistor.

14 Claims, 6 Drawing Sheets

(56) References Cited

OTHER PUBLICATIONS

French Preliminary Search Report for French Application No. 1258696 dated May 16, 2013, 10 pages.
Gopi et al., Independently Driven Double Gate FinFET Scalable to 10nm, 10th National Conference on Technological Trends, Nov. 6, 2009, pp. 319-324.
International Preliminary Preliminary Report on Patentability for International Application No. PCT/EP2013/068706 dated Mar. 17, 2015, 7 pages.
International Search Report for International Application No. PCT/EP2013/068706 dated Oct. 28, 2013, 4 pages.
International Written Opinion for International Application No. PCT/EP2013/068706 dated Oct. 28, 2013, 6 pages.
Ritzenthaler et al., Immunity to Substrate Effect in Advanced Omega/FET Devices, 2005 Sold-State Device Research Conference, Proceedings of 35th European, Sep. 12-16, 2005, pp. 81-84.
Rudenko et al., Substrate Bias Effect linked to Parasitic Series Resistance in Multiple-Gate SOI MOSFETs, IEEE Electron Device Letters, vol. 28, No. 9, Sep. 1, 2007, pp. 834-836.
Subramanian et al., Impact of Fin Width on Digital and Analog Performances of n-FinFETs, Solid State Electronics, vol. 51, No. 4, Apr. 10, 2007, pp. 551-559.
Chinese Office Action for CN Application No. 201380048327.X dated Nov. 1, 2016, 12 pages.

\* cited by examiner

SOI FINFET WITH REDUCED FIN WIDTH DEPENDENCE

CROSS-REFERENCE TO RELATED APPLICATIONS

This application is a national phase entry under 35 U.S.C. §371 of International Patent Application PCT/EP2013/068706, filed Sep. 10, 2013, designating the United States of America and published in English as International Patent Publication WO 2014/040981 A1 on Mar. 20, 2014, which claims the benefit under Article 8 of the Patent Cooperation Treaty and under 35 U.S.C. §119(e) to French Patent Application Serial No. 1258696, filed Sep. 17, 2012, the disclosure of each of which is hereby incorporated herein in its entirety by this reference.

TECHNICAL FIELD

This disclosure relates to the field of semiconductor technology. More specifically, it relates to the field of finfet transistors. Still more specifically, it relates to a method and a corresponding structure for polarizing finfet transistors.

BACKGROUND

Semiconductor technology has been following a constant trend of reducing the dimensions of integrated components, such as metal lines, resistors, diodes, transistors, etc. The reduction in dimensions allows more devices within a single integrated circuit, thereby providing more advanced functionality to the user. However, the minimum dimensions of modern semiconductor technology are such that it is becoming increasingly difficult not only to further reduce them, but also to precisely control them.

In particular, in the field of finfet transistors, when processing transistors with fin width below, for instance, 20 nanometers, it is technologically rather complex to get a single exact value for the fin width within an entire wafer, or even within a single chip. In particular, for technologies using such small dimensions, the width of the fin is defined by double patterning and this technology results in a range of values for the fin width over the wafer. Here, by "finfet," it is intended finfets with perpendicular side walls, or with tilted side walls, or double-gate finfet.

The threshold voltage VT of the finfet is, however, dependent on the width of the finfet. The off-current of the transistor is as well dependent on the threshold voltage VT. Therefore, if the fin width is not a single common value over the entire wafer, but rather a range of values, the off-current will change significantly, from transistor to transistor, as the fin width varies, thereby creating a spread of off-current values.

BRIEF SUMMARY

This disclosure has been made in view of this problem and it is an object thereof to provide a technology that allows control of the threshold voltage VT of the transistor and, therefore, a reduction of the off-current spread, even in the presence of a distribution of values for the fin width.

The disclosure can relate to a method for polarizing at least a first finfet transistor and a second finfet transistor, wherein the first finfet transistor can have a fin width bigger than the fin width of the second finfet transistor, and both the first finfet transistor and the second finfet transistor can have a back gate, and the method can comprise applying the same first voltage on the back gate of the first finfet transistor and on the back gate of the second finfet transistor so as to reduce the spread between the off-current value of the first finfet transistor and the off-current value of the second finfet transistor. Further, the disclosure can relate to a corresponding semiconductor structure comprising a first finfet transistor and a second finfet transistor, wherein the first finfet transistor can have a fin width bigger than the fin width of the second finfet transistor, and both the first finfet transistor and the second finfet transistor can have a back gate, and wherein the back gate of the first finfet transistor and the back gate of the second finfet transistor can be connected to a single first voltage source so as to reduce the spread between the off-current value of the first finfet transistor and the off-current value of the second finfet transistor.

This provides the beneficial advantage that the off-current spread can be reduced with a simple and robust design.

In some embodiments, the method can further comprise polarizing at least a third finfet transistor and a fourth finfet transistor, wherein the third finfet transistor can have a fin width bigger than the fin width of the fourth finfet transistor, and both the third finfet transistor and the fourth finfet transistor can have a back gate, and the method can comprise applying the same second voltage on the back gate of the third finfet transistor and on the back gate of the fourth finfet transistor so as to reduce the spread between the off-current value of the third finfet transistor and the off-current value of the fourth finfet transistor. Similarly, the corresponding semiconductor structure can further comprise at least a third finfet transistor and a fourth finfet transistor, wherein the third finfet transistor can have a fin width bigger than the fin width of the fourth finfet transistor, and both the third finfet transistor and the fourth finfet transistor can have a back gate, and wherein the back gate of the third finfet transistor and the back gate of the fourth finfet transistor can be connected to a single second voltage source so as to reduce the spread between the off-current value of the third finfet transistor and the off-current value of the fourth finfet transistor.

In some embodiments, both first and second finfet transistors can be NMOS-type transistors. Additionally, in some embodiments, both third and fourth finfet transistors can be PMOS-type transistors. Moreover, in some embodiments, the first voltage and the second voltage can be of opposite polarity.

This provides the beneficial advantage that the reduction of the off-current spread can be achieved, both for NMOS- and PMOS-type transistors with a simple and robust design. Additionally, the reduction can be achieved over an entire wafer, comprising both NMOS and PMOS transistors, by using only two voltage values for the correction.

In some embodiments, any of the finfet transistors can be any of a finfet with vertical side walls, or a finfet with tilted side walls, or a double-gate finfet.

BRIEF DESCRIPTION OF THE DRAWINGS

The invention will now be described in more detail by way of example hereinafter, using advantageous embodiments and with reference to the drawings. The described embodiments are only possible configurations in which the individual features may, however, as described above, be implemented independently of each other, or may be omitted, or may be combined between different embodiments. Equal elements illustrated in the drawings are provided with equal reference signs. Parts of the description relating to equal elements illustrated in the different drawings may be omitted. In the drawings.

DETAILED DESCRIPTION

A finfet 1000 in accordance with an embodiment of the disclosure will now be described with reference to FIG. 1A.

Figure 1A:
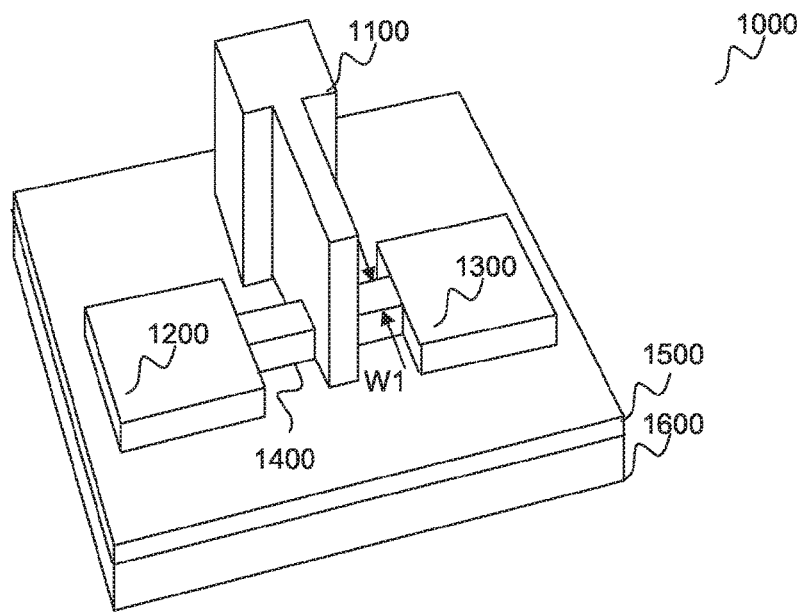
FIGS. 1A, 2A and 3A schematically illustrate a three-dimensional view of a finfet in accordance with an embodiment of the disclosure.

As can be seen in FIG. 1A, finfet 1000 comprises a gate 1100, a drain 1200, a source 1300 and a silicon and channel region 1400 below the gate. The silicon and channel region 1400 is separated from the gate by insulating layer 1700 (see FIG. 1B). Within the silicon and channel region 1400, a layer close to the insulating layer 1700 acts as channel for conduction of the channel carriers.

As described above, the width W1 of the silicon and channel region 1400, or fin, can be in the order of 20 nm, or smaller. The finfet 1000 is realized on an insulating layer 1500, separating at least the silicon and channel region 1400 from an underlying semiconductor layer 1600. In particular, the semiconductor layer 1600 can be used as a back gate 1600 for the silicon and channel region 1400, while gate 1100 can be used as a front gate 1100 for silicon and channel region 1400.

The semiconductor layer 1600 could be, for instance, silicon, while the insulating layer 1500 or 1700 could be, for instance, $SiO_2$, or especially 1700 could be a high-k dielectric layer. In this case, the finfet 1000 could be realized on what is known as a Silicon-On-Insulator (SOI) wafer. The present invention is, however, not limited thereto and the finfet can be realized with any technology that will allow the finfet 1000 to have a silicon and channel region 1400 that is subjected to the influence of at least two gates. Moreover, in FIG. 1A, the drain 1200, source 1300 and silicon and channel region 1400 are represented as being isolated blocks of material on top of insulating layer 1500. It will be clear to those skilled in the art that this has been done for ease of representation only and that those components could instead be realized on a semiconductor layer (not shown) on top of insulating layer 1500, by appropriately doping the corresponding regions. Similarly, the gate 1100 has been represented with a specific shape. The invention is, however, not limited thereto and any shape could be realized for gate 1100 as long as the front gate 1100 realizes a finfet by overlapping the silicon and channel region 1400 on at least two faces.

Figure 1B:
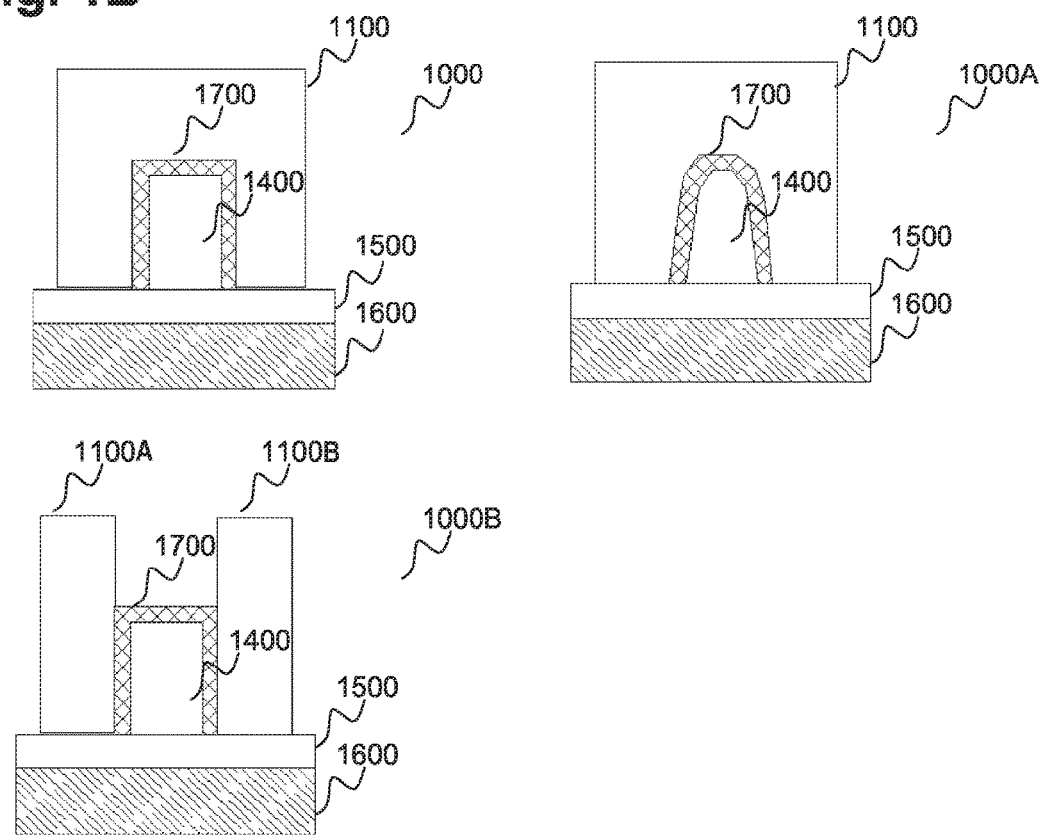
FIGS. 1B, 2B and 3B schematically illustrate cutaway views of the finfet of FIGS. 1A, 2A and 3A, respectively.

FIG. 1B schematically illustrates several alternative cut views of the silicon and channel region 1400 under the gate 1100. In particular, finfet 1000 corresponds to the finfet 1000 of FIG. 1A, where gate 1100 surrounds the silicon and channel region 1400 and has perpendicular walls around it. Finfet 1000A is an alternative realization for finfet 1000 of FIG. 1A where the walls of the gate 1100 surround the silicon and channel region 1400 but are tilted. Finfet 1000B is a yet alternative realization where the gate 1100 has two independent walls, 1100A and 1100B, each on one side of the silicon and channel region 1400, thereby realizing a double-gate finfet.

Figure 2A:
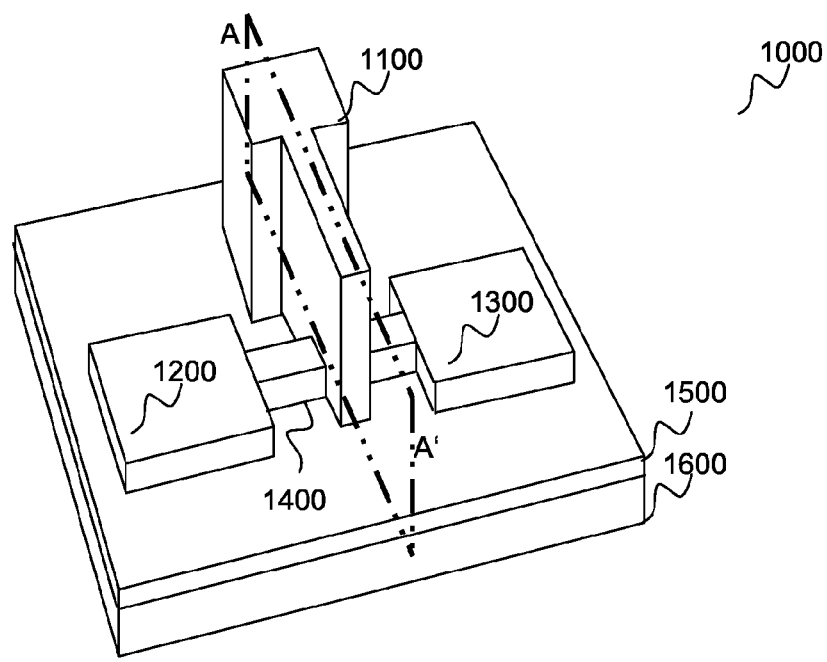
Figure 2B:
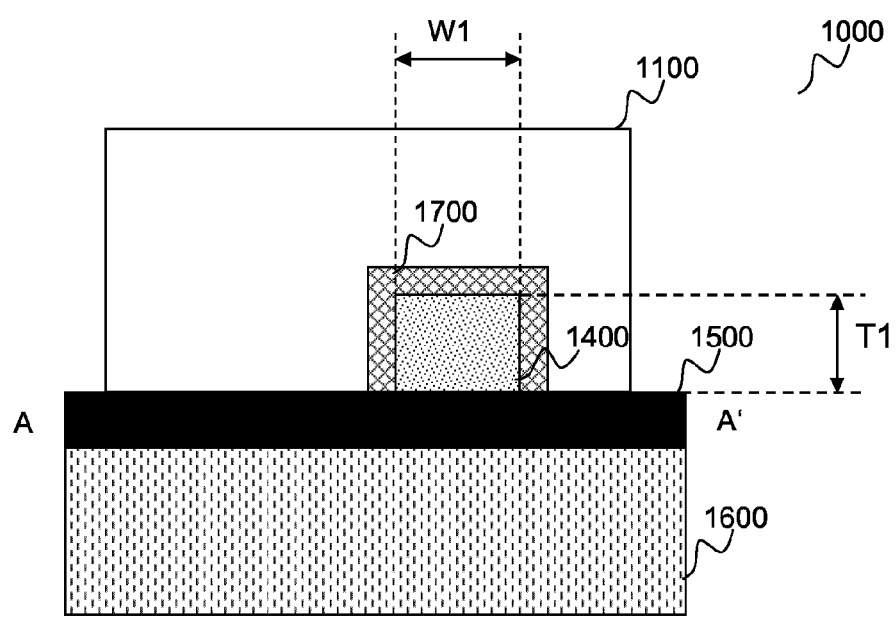
Figure 3A:
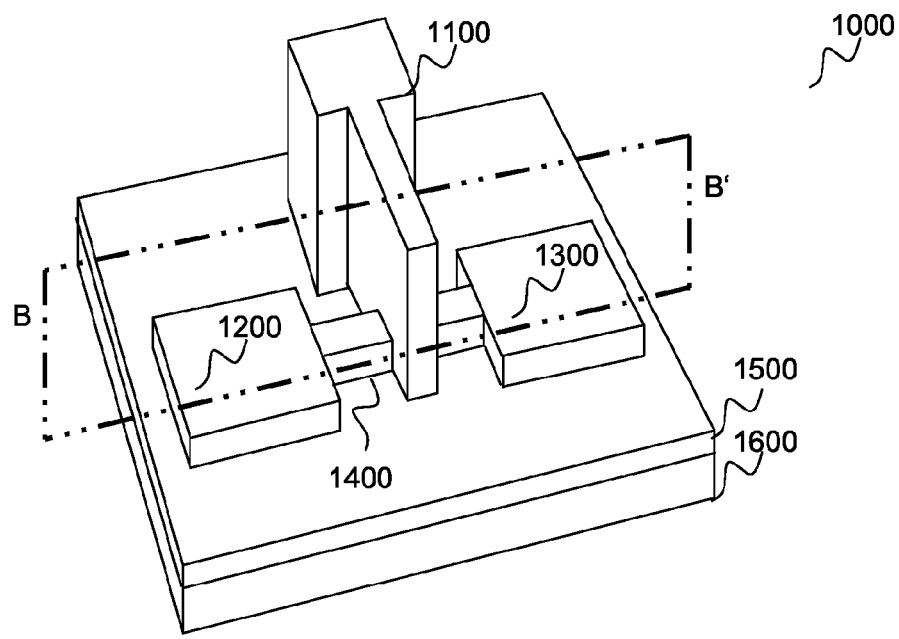
Figure 3B:
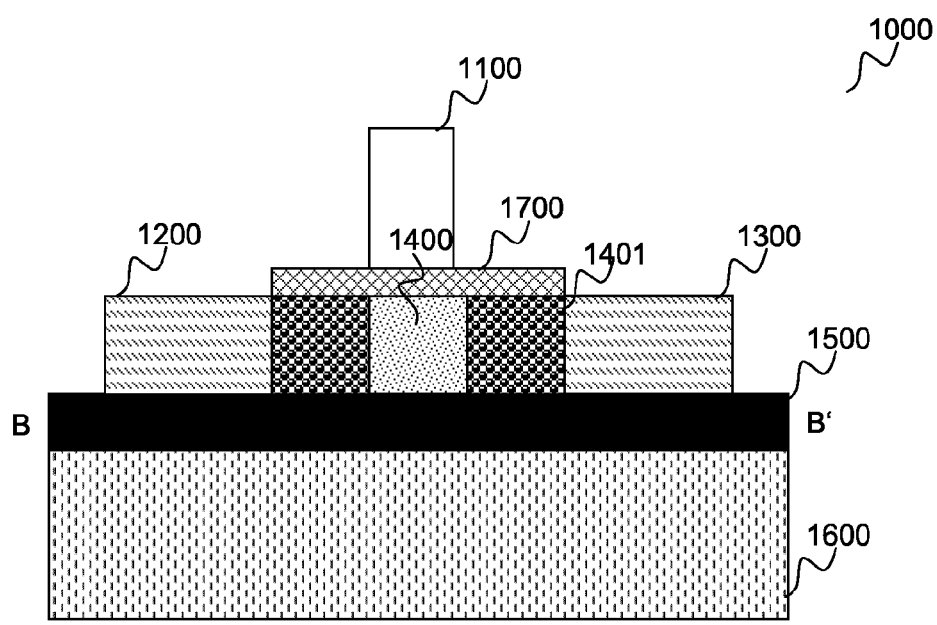

FIGS. 2A and 3A correspond to FIG. 1A, wherein cut planes A-A' and B-B' have been further illustrated. FIGS. 2B and 3B are two-dimensional cut views of the three-dimensional views of FIGS. 2A and 3A, respectively. In particular, FIG. 2B illustrates a cutaway view of FIG. 2A taken along plane A-A'. Similarly, FIG. 3B illustrates a cutaway view of FIG. 3A taken along plane B-B'.

As can be seen in FIGS. 2B and 3B, the finfet 1000 further comprises an insulating layer 1700, separating the silicon and channel region 1400 from the front gate 1100. In this manner, both the front gate 1100 and the back gate 1600 are separated from the silicon and channel region 1400 by insulating layer 1700 and insulating layer 1500, respectively. The material and thickness of the insulating layer 1700 and insulating layer 1500 are not necessarily the same. For instance, with respect to dimensions, insulating layer 1700 could be in the range of few nanometers in physical thickness, while insulating layer 1500 could be thicker, for instance, 10 nm or more. Silicon and channel region 1400 may also, in some embodiments, comprise doped regions 1401. Doped regions 1401 may be, for instance, n+ doped region for an nMOS transistor.

As described above, when realizing a plurality of finfets 1000 on a wafer, or in a chip, such as on semiconductor layer 1600, there is a problem that the fin width W1 is difficult to control to a single and precise value. This results in the presence of several values for the fin width W1, thereby resulting in several different threshold voltages VT, each value being associated with a different fin width W1 and, in turn, resulting into several different off-current values, each value being again associated with a different fin width W1. In particular, when the width W1 increases, the off-current tends to increase too, for the same gate voltage applied on gate 1100. This results into unreliable and/or complex circuits, since the variation in the off-current can be in the range of one or two orders of magnitude, or potentially more, for width changes of only a few nanometers.

The disclosure solves this problem by the application of a voltage on the back gate of the finfet. In particular, the effect of the application of the voltage on the back gate 1600 will now be explained with reference to FIGS. 4A, 4B, 5A, 5B, 6A and 6B.

Figure 4A:
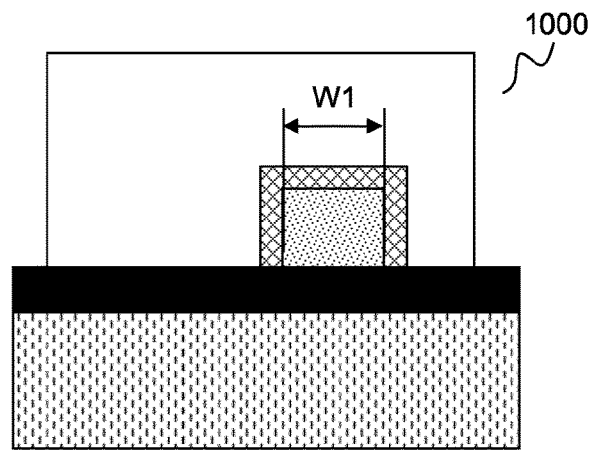
FIGS. 4A and 4B schematically illustrate the behavior of a smaller width finfet with respect to a voltage applied on its back gate, in accordance with an embodiment of the disclosure.
Figure 4B:
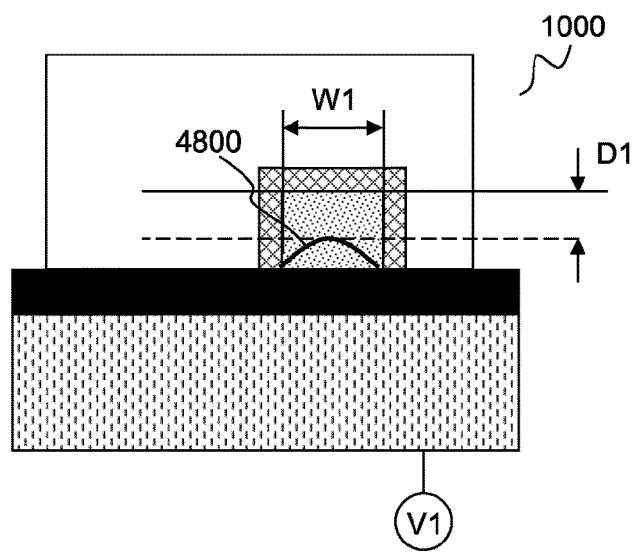

FIG. 4A corresponds to FIG. 2B and provides a cutaway view of the finfet 1000 having a fin width W1 and a zero or low voltage value applied on the back gate 1600. FIG. 4B corresponds to FIG. 4A, in which, however, a voltage V1 is applied on the back gate 1600, the value of V1 being bigger than the voltage value applied to the finfet 1000 in FIG. 4A. In particular, voltage V1 could be in the range of 0 V to −5 V for an NMOS-type finfet with a fin width W1 in the range of 10 nm to 20 nm and a thickness T1 in the range of 20 nm and 40 nm.

In FIG. 4B, line 4800 represents an equipotential voltage line 4800, or a constant voltage potential line, extending into silicon and channel region 1400, due to the effect of voltage V1 applied on back gate 1600. As can be seen, the equipotential line 4800 extends into the silicon and channel region 1400 to a maximum depth D1, in the range of 0 to 25 nm for a silicon thickness in the range of 10 nm to 40 nm and an insulating layer 1500 thickness in the range of 10 nm to 25 nm when voltage V1 is applied to the back gate 1600. The extension of the equipotential line 4800 within silicon and channel region 1400 graphically illustrates the effect of voltage V1 on finfet 1000. In electrical terms, the application of voltage V1 results in an increased threshold voltage of the finfet 1000. The more the equipotential line 4800 extends into the silicon and channel region 1400, the more the threshold voltage of the finfet 1000 is increased, with respect to the case in which no voltage V1 is applied to the back gate 1600, such as in FIG. 4A. Accordingly, the threshold voltage in the case of FIG. 4B is increased, when compared to FIG. 4A, thanks to the application of voltage V1.

Figure 5A:
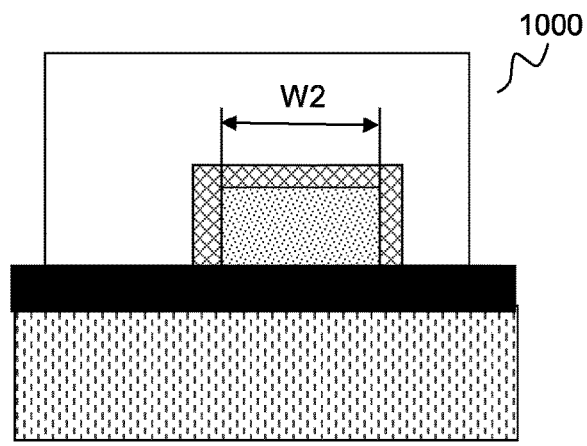
FIGS. 5A and 5B schematically illustrate the behavior of a larger width finfet with respect to a voltage applied on its back gate in accordance with an embodiment of the disclosure.
Figure 5B:
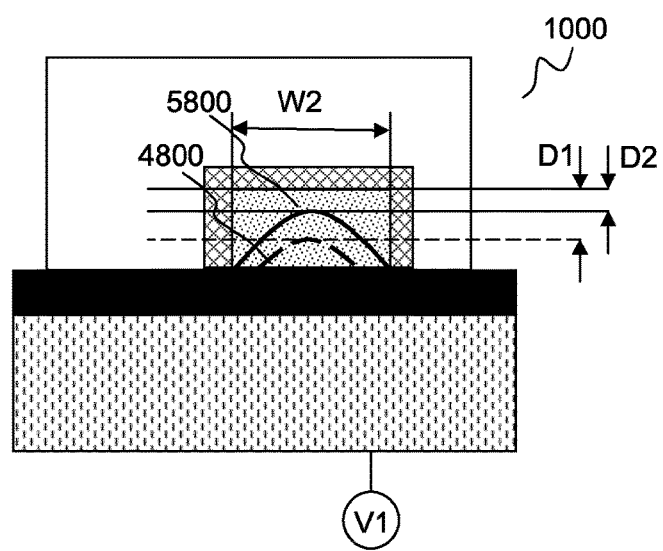

FIGS. 5A and 5B correspond to FIGS. 4A and 4B except that the width of the silicon and channel region 1400 is increased from a value W1 to a value W2, W2 being bigger than W1. As described above, this could result from a distribution of the fin width values, due to the manufacturing process of the finfet. Therefore, both finfet 1000 of FIGS. 4A and 4B and finfet 1000 of FIGS. 5A and 5B could be present at the same time on a single chip or wafer.

In FIG. 5A, just as for FIG. 4A, little or no voltage is applied to the back gate 1600. As for FIG. 4A then, no equipotential line in the silicon and channel region 1400 results from the effect of the back gate 1600. Symmetrically, in the case of FIG. 5B, the same voltage value V1 as of FIG. 4B is applied to back gate 1600. Also, in this case, the application of voltage V1 results into the appearance of an equipotential line 5800 extending within silicon and channel region 1400. However, since the width W2 of the finfet 1000 of FIG. 5B is bigger than the width W1 of the finfet 1000 of FIG. 4B, the effect of the same voltage V1 on the back gate 1600 is amplified. In other terms, as can be seen in FIG. 5B, the equipotential line 5800 extends more into silicon and channel region 1400, at a depth D2, smaller than the depth D1 of equipotential line 4800. As described above, the extension of the equipotential line 5800 graphically represents the effect of the voltage V1, applied on the back gate 1600, onto the threshold voltage VT of the finfet 1000. Accordingly, as the equipotential line 5800 propagates more into silicon and channel region 1400, the effect of voltage V1 onto the threshold voltage VT of finfet 1000 of FIG. 5B is bigger than the effect of the same voltage V1 on the finfet 1000 of FIG. 4B. In other terms, the threshold voltage VT of finfet 1000 of FIG. 5B is increased more than the threshold voltage VT of the finfet 1000 of FIG. 4B, even though the same voltage V1 is applied on the back gate 1600 in both cases. Still in other terms, when the fin width increases from a value W1 to a value W2, the same voltage V1 on the back gate 1600 achieves a more pronounced effect on the threshold voltage VT. This is beneficial since the threshold voltage VT of finfets 1000 having larger fin widths, such as W2, is lower than the threshold voltage VT of finfets 1000 having smaller fin widths, such as W1. Accordingly, the threshold voltage is increased more for those transistors having a smaller natural threshold voltage VT, such as the one depicted in FIGS. 5A and 5B, and increased less for those transistors having a larger natural threshold voltage VT, such as the one depicted in FIGS. 4A and 4B. Therefore, the bigger impact of the same back-gate voltage V1 on larger width transistors corrects more their threshold voltage VT, when compared to the effect of the same voltage V1 on smaller width transistors. This results in a self-adjusting VT for different fin width.

Figure 6A:
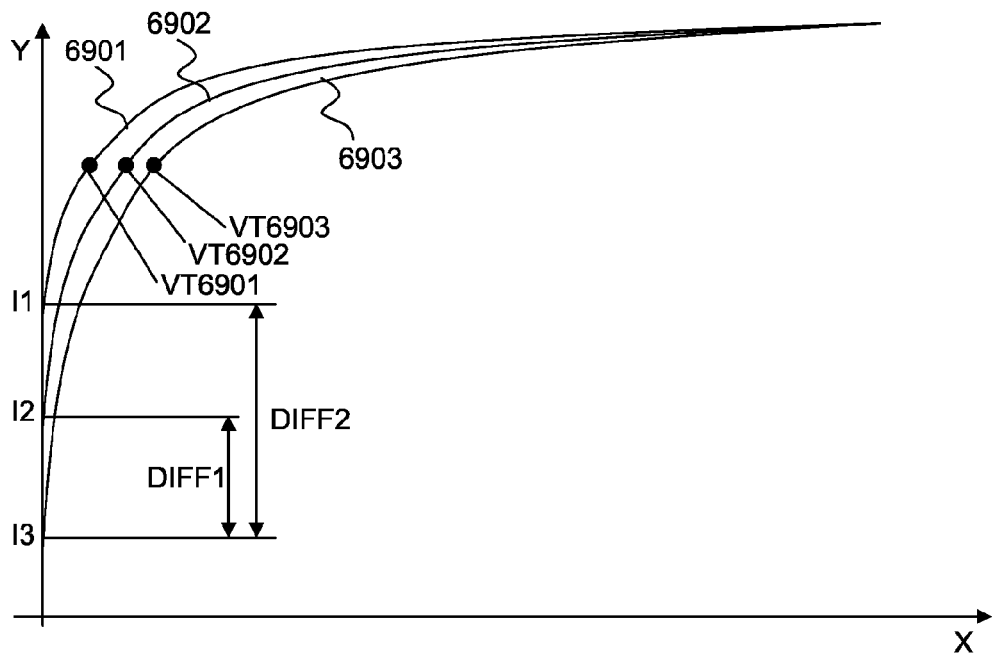
FIGS. 6A and 6B schematically illustrate the off-current to voltage characteristics of a finfet with respect to the presence or absence of a voltage applied on its back gate in accordance with an embodiment of the disclosure.
Figure 6B:
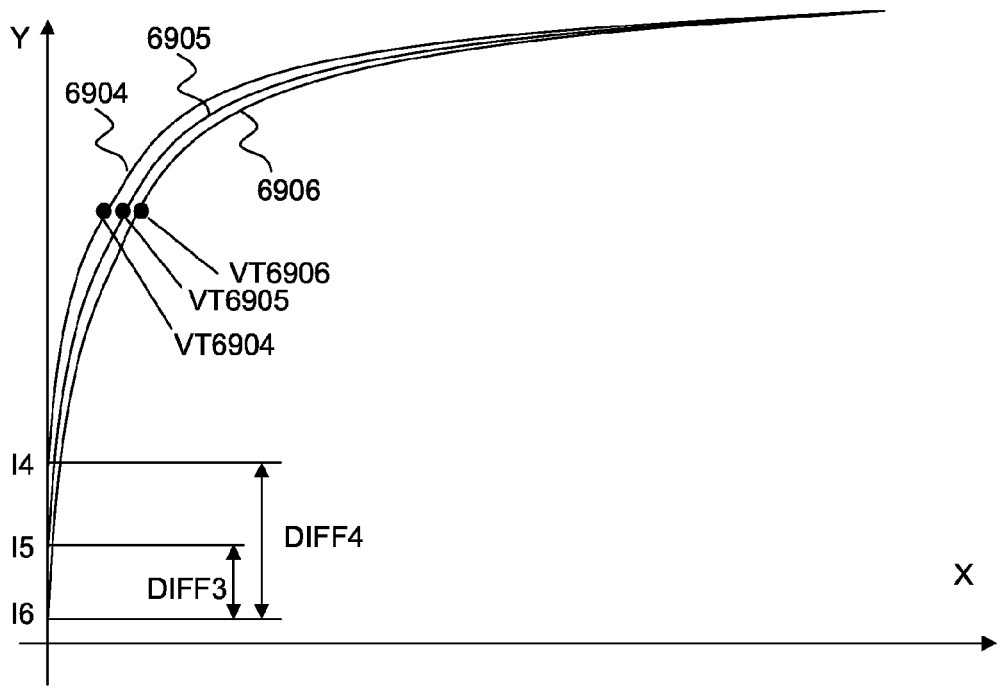

FIG. 6A, where V1 is low, for instance, zero Volts, and FIG. 6B schematically illustrate the effect of the application of voltage V1 on the back gate 1600 of the finfet 1000. In particular, both FIGS. 6A and 6B represent the current on the logarithmic Y-axis as a function of the front-gate voltage, as applied on gate 1100 on the linear X-axis.

As can be seen, the current generally increases with the increase of the front-gate voltage, as expected. Furthermore, as can be seen in FIG. 6A, multiple curves 6901-6903 are plotted, corresponding to finfets 1000 having different fin widths. In particular, the width of the silicon and channel region 1400 of the finfet 1000 corresponding to curve 6901 is bigger than the width corresponding to curve 6902, which is still bigger than the width corresponding to curve 6903. This can be seen since, at a constant gate voltage value of, for instance, 0 V corresponding to the intersection of the X- and Y-axis, the curve 6901 exhibits an off-current I1, which is bigger than I2, itself bigger than I3. This implies that the threshold voltage VT of the transistor corresponding to curve 6901, having the biggest width among the three curves, is the smallest of the three. Conversely, the threshold voltage VT of the transistor corresponding to curve 6903, having the smallest width among the three curves, is the biggest of the three.

In particular, the threshold voltage VT for curves 6901-6903 is schematically represented as VT6901, VT6902, and VT6903, respectively. The difference spread in VT in FIG. 6A can, therefore, be defined as deltaVT(6A) and is given by VT6903-VT6901 when the voltage V1 applied on the back gate is low, for instance, 0 Volts.

As described above, the differences DIFF1, DIFF2, in the value of the off-current for curves 6901-6903 complicates, or renders impossible, the usage of finfet 1000 in circuits having a range of value for the fin widths. However, as described above, this can be solved by the application of voltage V1 on the back gate 1600. In particular, FIG. 6B illustrates the same electrical characteristics of the three finfets used for obtaining curves 6901-6903, when a voltage V1 is applied on their back gate.

As can be seen in FIG. 6B, curves 6904-6906, realized based on the finfets used for curves 6901-6903, respectively, exhibit a difference DIFF3 between values I5 and I6 smaller than the difference DIFF1 between the corresponding values I2 and I3. Similarly, curves 6904-6906 exhibit a difference DIFF4 between values I4 and I6 smaller than the difference DIFF2 between the corresponding values I1 and I3. In other words, the application of the voltage V1 on the back gate 1600 reduced the spread of the values of off-current, caused by the range of values representing the different widths of the finfets used for curves 6901-6903 and 6904-6906. This is due to the fact that the correction of the threshold voltage VT is more effective where most needed on the larger width transistor, while it is less strong where less needed on the small width transistors. That is, thanks to the application of the voltage V1, the differences in off-currents caused by the different widths of the transistors are reduced.

In particular, the threshold voltage VT for curves 6904-6906 is schematically represented as VT6904, VT6905, and VT6906, respectively. The difference spread in VT in FIG. 6B can, therefore, be defined as deltaVT(6B) and is given by VT6906-VT6904. Using a voltage with a value V1 as described above, the spread in threshold voltage VT in FIG. 6B is thus smaller than in FIG. 6A. In other terms, deltaVT (6B)<deltaVT(6A). Applying a voltage V1 as described above, therefore, helps to get a smaller VT distribution over the wafer and also lower leakage current.

Particularly, the application of the voltage V1 results in an off-current I4, I5 and I6, each of which is smaller than the corresponding off-current I1, I2 and I3, respectively. At the same time, since the correction in threshold voltage VT carried out by the voltage V1 is more effective on the bigger width transistor, corresponding to curve 6901, the reduction in off-current will be stronger between value I1 and the corresponding value I4, than compared to the reduction between I3 and the corresponding value I6.

Accordingly, as described above, the disclosure achieves a reduction of the spread of off-currents for finfet transistors 1000 with a simple and effective method, consisting in the application of a voltage V1 on the back gate 1600 of the finfet transistor. Since the effect of the voltage V1 is more pronounced where more needed, on larger width transistors, the method can advantageously be used to reduce the off-current spread on an entire chip or wafer, while using a single voltage value V1, or a reduced number of values for voltage V1 in different areas, which greatly simplify the design of the chip, since it does not require a specific correction, with possibly a specific voltage, for each single finfet transistor.

Although in the above-described embodiments the finfet 1000 has been described with reference to the usage of a semiconductor layer 1600 from implementing the back gate, the present invention is not limited thereto. Alternatively, or in addition, the back gate could be realized by a conductor layer, such as a metal.

Additionally, although reference has been made above to NMOS-type transistors, it will be appreciated by those skilled in the art that a corresponding technique can be applied to PMOS transistors too, in particular, at the same time. In the presence of both types of transistors, if needed, two voltage values can be used for the correction of the spread of the off-currents, one voltage value V1 for the NMOS-type finfets and one voltage value V2 for the PMOS-type finfets. For instance, while V1 may be a negative voltage, V2 may be a positive voltage. Even more specifically, V1 and V2 could be symmetrical with respect to each other, so as to reduce complexity of the design.

It will furthermore be clear to those skilled in the art that the numerical values described above are only one of the possible many combinations of values, which results in the advantageous effect of the disclosure. In particular, the voltage value applied on the back gate 1600 of the finfet 1000 will depend, for instance, on the distribution of fin widths W1, W2, across the wafer, as well as the value of the thickness of the insulating layer 1500, among others, and that an ideal voltage value V1 for the desired correction of the off-currents spread can be computed by using standard semiconductor electrical simulation software, or a heuristic approach.

Additionally, it will be clear that although an example with three finfets has been discussed with reference to FIGS. 6A and 6B, the disclosure is not limited thereto and can be applied to any number of finfets. Advantageously, the disclosure can be applied to several thousand finfets, or even more, at the same time, with a simple circuitry due to the reduced number of values of correction voltages to be applied on the back gate of the finfets.

Furthermore, the application of the voltage does not need to be constant during the operation of the chip. For instance, if needed, the correction voltage V1 and/or V2 can be applied to the back gate 1600 only at specific intervals, such as during stand-by of the chip, or to sub-components of the chip during stand-by of those sub-components. Even more specifically, different values for voltages V1 and/or V2 can be applied during the operation of the circuit. For instance, a voltage value V1 having a larger correction effect can be applied during stand-by of the circuit, so as to both maximize the correction of the off-current spread, and to reduce the total value of off-currents, while a voltage value V1 having a lesser correction effect can be applied during operation of the circuit, so as to result in a faster computation.

The invention claimed is:

1. A method for polarizing at least a first finfet transistor and a second finfet transistor, the method comprising:
   providing a first finfet transistor and a second finfet transistor, the first finfet transistor having a fin width bigger than a fin width of the second finfet transistor, and both the first finfet transistor and the second finfet transistor have a back gate;
   wherein the width of the fin of each of the first finfet transistor and the second finfet transistor is in a range between 10 nm and 20 nm;
   applying the same first voltage on the back gate of the first finfet transistor and on the back gate of the second finfet transistor so as to reduce a spread between an off-current value of the first finfet transistor and an off-current value of the second finfet transistor;
   wherein the first voltage applied on the back gate of the first finfet transistor and on the back gate of the of the second finfet transistor is constant during reading or writing of the first finfet transistor and/or the second finfet transistor.

2. The method according to claim 1, wherein both first and second finfet transistors are NMOS-type transistors.

3. The method according to claim 2, further comprising:
   polarizing at least a third finfet transistor and a fourth finfet transistor,
   wherein the third finfet transistor has a fin width bigger than a fin width of the fourth finfet transistor, and both the third finfet transistor and the fourth finfet transistor have a back gate, and
   applying the same second voltage on the back gate of the third finfet transistor and on the back gate of the fourth finfet transistor so as to reduce a spread between an off-current value of the third finfet transistor and an off-current value of the fourth finfet transistor;
   wherein the second voltage applied on the back gate of the first finfet transistor and on the back gate of the of the second finfet transistor is constant.

4. The method according to claim 3, wherein both third and fourth finfet transistors are PMOS-type transistors.

5. The method according to claim 4, wherein the first voltage and the second voltage are of opposite polarity.

6. The method according to claim 5, wherein the first voltage comprises a negative voltage and the second voltage comprises a positive voltage.

7. The method according to claim 6, wherein the negative voltage and the positive voltage are symmetrical with respect to each other.

8. The method according to claim 3, wherein both third and fourth finfet transistors are NMOS-type transistors.

9. The method according to claim 1, wherein at least one of the first and second finfet transistors comprises a finfet with vertical side walls, a finfet with tilted side walls, or a double-gate finfet.

10. The method according to claim 2, wherein applying the same first voltage on the back gate of the first finfet transistor and on the back gate of the second finfet transistor comprises applying the same negative voltage on the back gate of the first finfet transistor and on the back gate of the second finfet transistor.

11. The method according to claim 10, wherein applying the same first voltage on the back gate of the first finfet transistor and on the back gate of the second finfet transistor comprises applying the same positive voltage on the back gate of the first finfet transistor and on the back gate of the second finfet transistor.

12. The method according to claim 2, wherein each of the first finfet transistor and the second finfet transistor comprise a gate, a drain, a source, and a channel region extending between the source and the drain, and wherein a width of the channel region defines the fin width of one of the first finfet transistor and the second finfet transistor.

13. The method of claim 12, wherein applying the same first voltage on the back gate of the first finfet transistor and on the back gate of the second finfet transistor comprises applying a voltage in the range of 0 V to −5 V on the back gate of the first finfet transistor and on the back gate of the second finfet transistor.

14. The method according to claim 1, wherein both first and second finfet transistors are PMOS-type transistors.

* * * * *